(12) United States Patent
Maloney

(10) Patent No.: US 6,365,236 B1
(45) Date of Patent: Apr. 2, 2002

(54) METHOD FOR PRODUCING CERAMIC COATINGS CONTAINING LAYERED POROSITY

(75) Inventor: Michael J. Maloney, Manchester, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 09/468,026

(22) Filed: Dec. 20, 1999

(51) Int. Cl.$^7$ .................................................. C23C 8/00
(52) U.S. Cl. .................. 427/585; 427/250; 427/255.28; 427/255.7; 427/404; 427/419.2
(58) Field of Search ........................... 427/250, 255.28, 427/255.7, 404, 419.2, 585

(56) References Cited

U.S. PATENT DOCUMENTS

| | | |
|---|---|---|
| 3,928,026 A | 12/1975 | Hecht et al. ............... 75/134 F |
| 4,039,296 A | 8/1977 | Levinstein ................. 428/553 |
| 4,321,311 A | 3/1982 | Strangman .................. 428/623 |
| 4,405,659 A | 9/1983 | Strangman ............... 427/248.1 |
| 4,405,660 A | 9/1983 | Ulion et al. ............. 427/248.1 |
| 4,419,416 A | 12/1983 | Gupta et al. ................. 428/656 |
| 4,676,994 A | 6/1987 | Demaray ..................... 427/42 |
| 5,035,923 A | * 7/1991 | Sarin |
| 5,087,477 A | 2/1992 | Giggins, Jr. et al. .......... 427/38 |
| 5,262,245 A | 11/1993 | Ulion et al. ................ 428/469 |
| 5,514,482 A | 5/1996 | Strangman .................. 428/623 |
| 5,536,022 A | 7/1996 | Sileo et al. ............. 277/235 A |

* cited by examiner

*Primary Examiner*—Bernard Pianalto
(74) *Attorney, Agent, or Firm*—F. Tyler Morrison III

(57) ABSTRACT

Methods of producing layered ceramic coatings in which some layers contain porosity are described, as are the coatings produced. The different layers are applied at different temperature conditions by periodically inserting a heat blocking shield between the heat source and either the evaporation source and/or an external heater. As applied, some of the layers have a Zone I structure and some have a Zone II type structure. Heat treatment may be used to increase the porosity in the Zone I structure layers.

15 Claims, 3 Drawing Sheets

(Gd,Y,Zr)O2, PERIODIC MESH, H.T.2200°F/24Hr

METHOD FOR PRODUCING CERAMIC COATINGS CONTAINING LAYERED POROSITY

CROSS REFERENCE TO RELATED APPLICATION

Some of the subject matter disclosed herein is disclosed in commonly owned U.S. patent application Ser. No. 08/972,589, filed on Nov. 18, 1997, U.S. Pat. No. 6,057,047 entitled "Ceramic Coatings Containing Layered Porosity", which is expressly incorporated by reference herein.

BACKGROUND OF THE INVENTION

This invention relates to the field of ceramic thermal barrier coatings and to abradable ceramics for use in gas turbine seal applications, and more particularly to a method of producing ceramic thermal barrier coatings and abradable seals comprised of multiple layers in which at least one of the layers is porous.

Gas turbine engines are widely used as sources of motive power, and for other purposes such as electric generation and fluid pumping. Gas turbine manufacturers face a constant customer demand for better performance, enhanced efficiency and improved life. One way to improve performance efficiency and performance is to increase operating temperatures. Increasing operating temperatures usually reduces engine life and is effective only within the limits of materials used in the engine.

Current gas turbine engines are predominantly constructed of metallic materials, with nickel base and cobalt base superalloys being widely used in the higher temperature portions of the engine. Such superalloys are currently used in engines at gas temperatures which are very near, and in some cases above, the melting point of the superalloys. Increases in engine operating temperature are not possible without concurrent steps to protect the superalloys from direct exposure to these high gas temperatures at which the materials would otherwise melt. Such steps include the provision of cooling air (which reduces engine efficiency) and the use of insulating coatings.

Insulating ceramic materials, particularly providing these materials in the form of coatings or thermal barrier coatings, are the primary subject of this invention. Such coatings are most commonly composed of ceramic and are commonly applied by plasma spraying or by electron beam vapor deposition. This invention focuses on coatings applied by electron beam vapor deposition, which is described for example in U.S. Pat. Nos. 4,405,659; 4,676,994 and 5,087,477. Exemplary patents which discuss the current state of the art thermal barrier coatings include U.S. Pat. Nos. 4,321,311; 4,405,660; 5,262,245 and 5,514,482.

The most widely used thermal barrier coating for application to rotating components in turbine engines comprises a bond coat material whose composition is described in U.S. Pat. No. 4,419,416, including a thin layer of aluminum oxide on the bond coat and a columnar grain ceramic coating adhered to the aluminum oxide layer as described in U.S. Pat. No. 4,405,659, developed by the assignee of the present invention. Despite the success of this thermal barrier coating and its widespread acceptance there is a desire for advanced thermal barrier coatings, the principle desired enhancement being improved specific thermal insulation properties, i.e., thermal insulation corrected for density.

If a coating with improved density-corrected insulation properties could be developed, such a coating could either be used at the same thickness as that now used commercially to reduce heat flow, thereby allowing for a reduction in cooling air and enabling a corresponding increase in engine efficiency, or could be used at a reduced thickness to provide the same degree of insulation and heat flow but with reduced coating weight. Such weight reductions are significant, especially on rotating components, since the weight of the thermal barrier coating results in centrifugal forces during engine operation of thousands of pounds on a single turbine blade in a large aircraft engine. Reducing blade centrifugal forces has positive implications in the design requirements of engine components associated with the blade, in particular the supporting disc.

Gas turbine efficiency can also be improved by reducing gas leakage. In particular the clearance between the tips of the rotating blade and the surrounding case structure must be minimized. This is commonly accomplished by providing an abradable seal material on the case. In operation the blade tips cut a channel in the abradable, thus reducing gas leakage. See, e.g., U.S. Pat. Nos. 4,039,296 and 5,536,022, which are expressly incorporated herein by reference.

SUMMARY OF THE INVENTION

The present invention comprises a layered ceramic material, preferably applied as a coating. Different layers in the structure have different microstructures, with at least one of the layers being relatively dense and lower defect-containing, and another of the layers being less dense and higher defect-containing. The structure of the less dense layer can be modified by heat treatment to provide porosity. Porosity provides reduced thermal conductivity, and for seal applications the porosity also provides improved abradability. The layers are preferably deposited by electron beam physical vapor deposition. The layers are applied under conditions which produce the previously mentioned differences in density and porosity between alternating layers, by altering the temperature of the substrate and material as deposited.

The relatively dense layers are applied by electron beam vapor deposition under conditions which result in the deposition of what those knowledgeable in the physical vapor deposition art refer to as Zone II structures. The less dense layers (i.e. the layers which will become porous) are also applied by EB-PVD and under conditions which result in microstructures that those skilled in the physical vapor deposition art referred to as Zone I structures. As used herein, the term Zone I means a layer having either an as-deposited Zone I structure or an as-deposited Zone I structure which has been heat treated to enhance porosity.

The resultant structure may be heat treated to enhance porosity through sintering which increases pore size and densifies the ceramic portions which surround the pores.

The invention coating finds particular application in the field of gas turbine components. Such components include turbine airfoils (blades and vanes) and abradable seals which are intended to interact with blade tips or knife edge seals to reduce unwanted gas flow.

DESCRIPTION OF PREFERRED EMBODIMENTS

Figure 1:
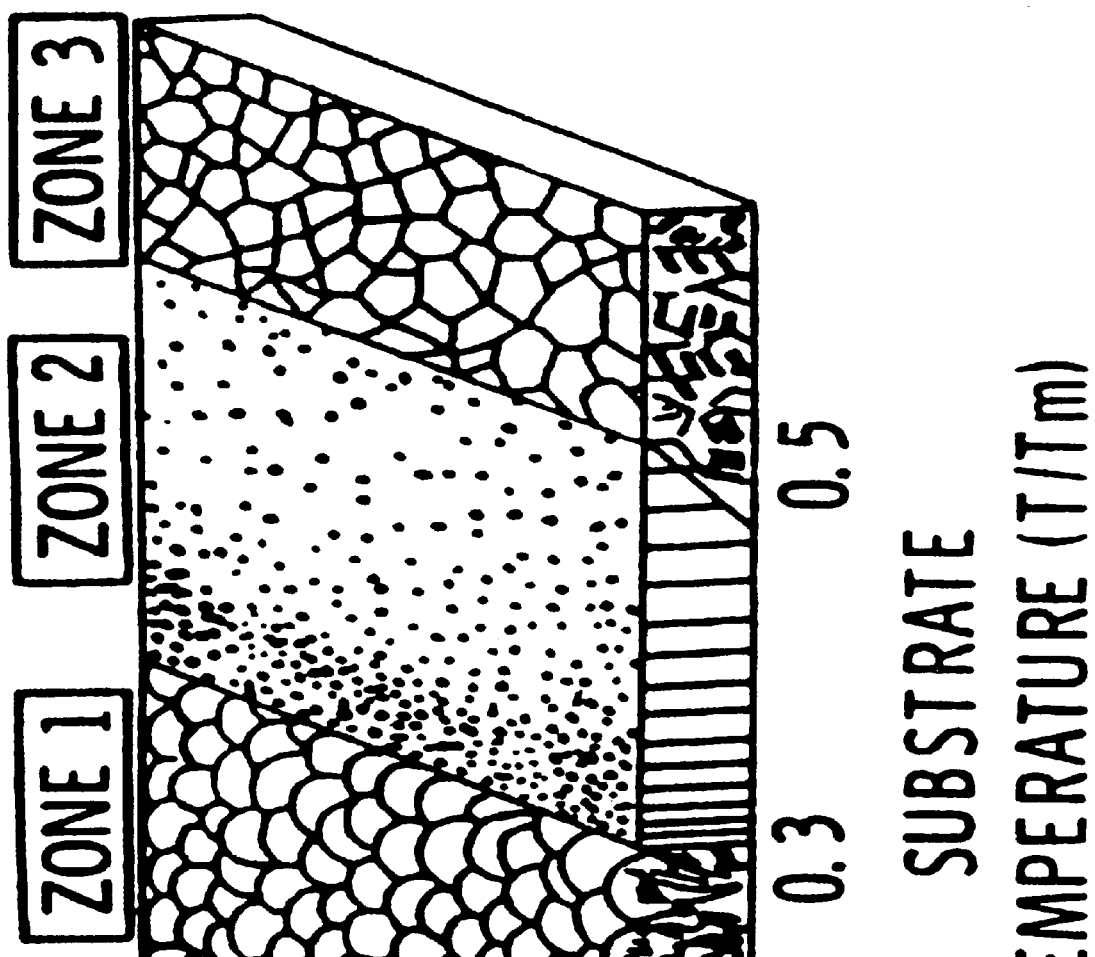
FIG. 1 shows the structure of EB-PVD deposited coatings as a function of substrate surface temperature.

Physical vapor deposition of ceramics, including electron beam and sputtering techniques, has been widely studied. A paper published in 1969 by B. A. Movchan and A. B. Demchishin entitled "Study of the Structure and Properties of Thick Vacuum Condensates of Nickel, Titanium, Tungsten, Aluminum oxide, and Zirconium oxide" in the Journal Physics of Metallurgy and Metallography (USSR), vol. 28 p. 83, analyses the vapor deposition of materials under different conditions. These authors were the first to characterize the structure of electron beam physical vapor deposited coatings as a function of substrate surface temperature. FIG. 1 from the paper is reproduced as FIG. 1 herein. In 1974, Thornton published a similar paper related to sputter deposition, J. Vac. Science Technology 11:666.70, (1974) with similar conclusions.

FIG. 1 shows the three zones which occur in physical vapor deposited coatings as a function of substrate surface temperature during deposition. Zone I is a low density coating with a large defect content, which may include micropores, microvoids, dislocations, vacancies and the like. Zone II is a more dense columnar grain structure in each column, and is a single grain. Zone III is a yet more dense, essentially fully dense coating comprised of equiaxed recrystallized grains. Though not fully understood, it is believed that the change in deposit character, which effectively increases in density with increasing substrate temperature, results from the enhanced mobility of vapor deposited atoms after they strike the substrate surface.

For ceramics, Movchan et al. determined that the boundary between Zone I and Zone II typically occurred at a homologous temperature (homologous temperature refers to the fraction of the absolute melting temperature of the material) of between 0.22 and 0.26 and the boundary between Zones I and m typically occurred at a homologous temperature of between about 0.45 and 0.5.

It can be seen that a single ceramic composition can be deposited so as to have three different structures by controlling the temperature of the substrate surface on which the coating is being deposited. Since deposited coating microstructure is a function of the substrate temperature it can also be seen that different ceramic materials with different melting points and therefore different homologous temperatures might be deposited on a substrate at constant surface temperature and exhibit different zone structures.

The substrate surface temperature refers to the temperature at the surface on which the coating is deposited, this temperature often differs from the bulk substrate temperature and is affected by radiant energy flux and the energy input into the surface by coating material which strikes the surface, and may be enhanced by use of external heaters. Higher substrate surface temperatures permit lateral diffusion of deposited atoms which results in higher density deposits.

The essence of the present invention is a method of depositing at least one layer having a Zone I structure and at least one layer having a Zone II or Zone III structure. Deposition may be followed by appropriate heat treatment. A guideline for appropriate heat treatment temperature is a temperature in excess of about 0.5–0.8 of the homologous temperature of the layer composition in order to provide the porosity. Preferably a layer of the Zone I structure is located between adjacent layers of Zone II structures. The Zone I structure, being less dense, inhibits heat flow and thereby provides thermal insulation. The less dense structure will also be more abradable for seal applications. The relatively more dense Zone II structure layer provides mechanical strength. Layer thickness may vary, for example, between 0.05 and 5000 microns and preferably between 0.1 and 1000 microns. Total coating thickness may range, for example, from about 10 microns to about 1 mm for thermal barrier coatings and up to about 5 mm for abradable coatings.

As discussed in the above mentioned application, practical applications of the invention may contain many alternating layers of materials, e.g., more than 10 layers and even more than 100 layers. Practical applications of the invention will preferably also employ heat treatments after the deposition of the layered coating to cause sintering of the Zone I structure and the formation of larger, agglomerated pores or porosity. Such pore agglomeration enhances the mechanical properties of the coating by densifying the ceramic in regions between the pores. Average pore size exceeds 0.01 and preferably 0.1 micron. The resultant pores have a rounded shape characterized in that for a pore of average diameter "D" (measured on multiple diameters), the smallest radius of the pore wall will be greater than 0.1 D and preferably greater than 0.3 D.

A bond coat (or at least an alumina layer) will usually be positioned between the substrate and the invention layered porosity coating. Preferred bond coats include those coatings known as MCrAlY coatings and aluminide coatings. Both types of coatings form dense, adherent alumina layers of reasonable purity and it is this alumina layer to which the inventive coating adheres.

The concept of this invention may be better understood through consideration of the following example which is meant to be illustrative rather than limiting.

EXAMPLE

A single crystal superalloy substrate having a nominal composition of 5% Cr, 10% Co, 1.9% Mo, 5.9% W, 3% R, 8.7% Ta, 5.65% Al, 0.1% Hf. balance Ni was provided. The surface of the substrate was cleaned by alumina grit blasting, and a thin MCrAlY type bond coat layer having a nominal thickness of about 0.005 inch [125 $\mu$m] and nominal composition of about 22% Co, 17% Cr, 12.5% Al, 0.25% Hf. 0.4% Si, 0.6% Y, bal. Ni was applied. The bond coat was deposited by conventional plasma spray techniques. The bond coat surface was then glass bead peened to enhance its density. A heat treatment step was then performed to develop a thermally grown oxide layer (predominantly alumina). The treatment was performed at 1500° F. for 15 minutes at an oxygen flow of 70 sccm at a pressure of about $10^{-4}$ torr. Minimal experimentation will be required to develop the desired oxide thickness.

A layered coating composed of alternating layers of yttria stabilized ceria (12 wt. % yttria), alternating between less dense and more dense layers, was then applied on the bond coat surface. Coating thicknesses were about 0.25 microns per layer. Several pairs of coating layers were applied. See, e.g., FIG. 2.

These coating layers were applied using an electron beam to evaporate the ceramic materials. The source material was evaporated by an electron beam operating at about 10 kilovolts and a current of about 0.4 amps for an evaporation power of about 4 kW. The standoff distance from the substrate to the ceramic source was about 3 inches. The substrate was rotated during deposition.

The beam dwelled on the source continuously, with a heat blocking metal screen repeatedly being positioned between the source and the substrate for 16 second intervals and then followed by removal for 8 second intervals. The screen was composed of stainless steel and contained apertures of about 4 millimeters. The coatings were applied at a reduced pressure of about $4\times10^{-6\ torr}$ and oxygen was flowed into the chamber at a rate of about 70 standard cubic centimeters per minute to ensure coating stoichiometry.

Thermal radiation from the evaporating target material was the primary source for substrate surface heating (above the bulk substrate temperature) during the electron beam physical vaporization coating process. The substrate surface was heated to a greater degree in the absence of the screen being positioned between the source and the substrate, and to a lesser degree when the screen was positioned between the source and the substrate to reduce heat flow from the source to the substrate. This process resulted in alternating yttria-ceria layers having a more dense Zone II structure and layers having a less dense Zone I structure containing microvoids and microporosity. See, e.g., FIG. 2 The estimated porosity of the as-deposited Zone It yttria-ceria was relatively low, e.g., a few percent, and the porosity was substantially higher (a porosity of about 50%) in the Zone I yttria-ceria.

The yttria-ceria composition has a relatively high vapor pressure and vaporizes readily at a much lower temperature, apparently by sublimation, and so does not form a hot molten pool such as that formed during true evaporation. Materials such as yttria-ceria, which have a relatively high vapor pressure, provide less heat during vaporization than other materials, such as yttria stabilized zirconia and thus heat the substrate to a lesser degree. In these cases, it may be desirable to employ external heaters to raise the substrate temperature. In this case, the screen would be positioned between the source and the substrate, between the external heater and the substrate, or both.

In summary, the substrate surface being coated was at a relatively high temperature during deposition of yttria-ceria in the absence of the screen and the vapor condensed as a Zone II type structure. However, the substrate surface was at a relatively low temperature during deposition of yttria-ceria with the screen positioned between the source (and any external heater) and the substrate and the limited heating, and the associated vapor cloud condensed as a Zone I type structure.

In the case of yttria-ceria or other material that may not adhere well to a bond coat or alumina layer if deposited at lower temperatures (another reason favoring the use of an external heater above), it may be desirable to use a layer of a ceramic bond coat material, such as yttria stabilized zirconia, as an initial layer or ceramic "bond coat". Such a ceramic bond coat is described in commonly owned application Ser. No. 09/118,540, filed on Jul. 7, 1998 entitled "Article Having a Durable Ceramic Coating", which is hereby incorporated by reference herein. The layer should be thick enough to ensure complete coverage of the surface to be coated up to about 0.5 mils for example, but no thicker than necessary to ensure a continuous layer particularly where weight is a consideration, for example where the coating is to be applied to rotating components.

Figure 3:
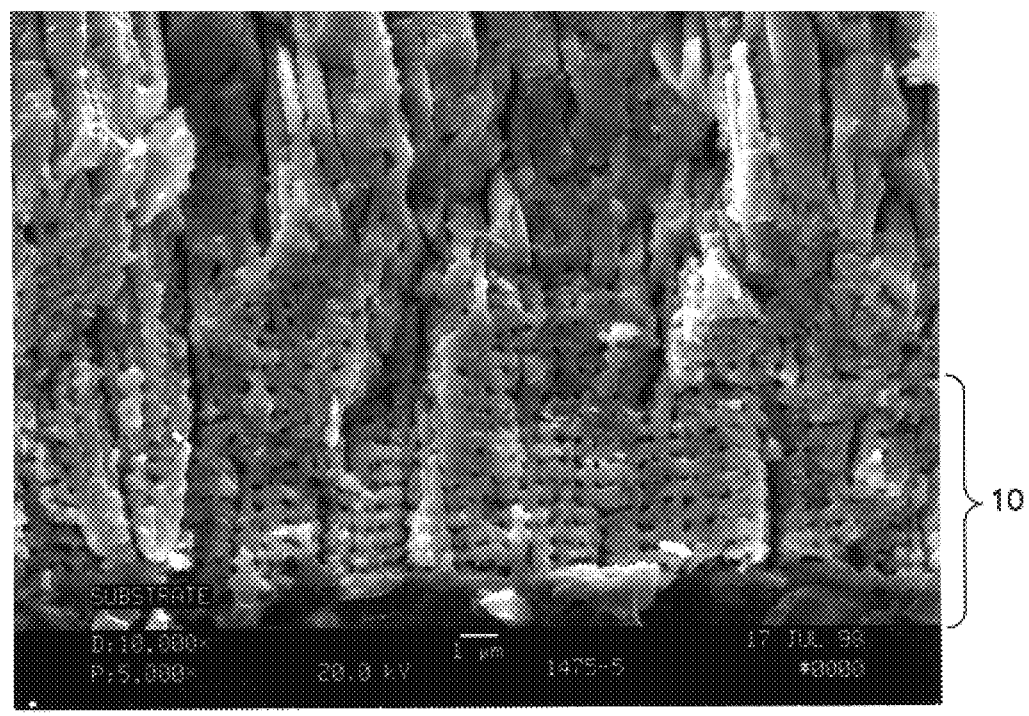
FIG. 3 shows the microstructure of another coating applied according to the invention, after a heat treatment.

Other samples were prepared using gadolinia stabilized zirconia. The samples includes about 33 mol. % gadolinia, balance 7YSZ as the stabilized zirconia, and was deposited in a manner similar to that described above. The as-deposited coating was then heat treated at about 2200° F. for about 24 hours. The resultant layered porosity is illustrated in the region indicated at 10 of FIG. 3.

Figure 2:
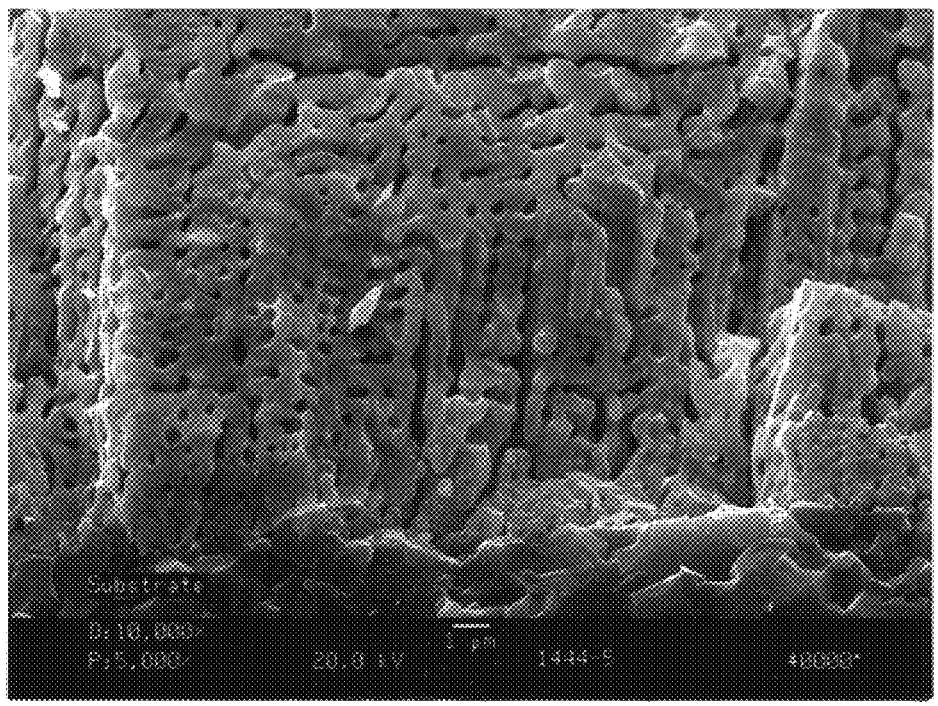
FIG. 2 shows the microstructure of a coating applied according to the invention as deposited.
Figure 4:
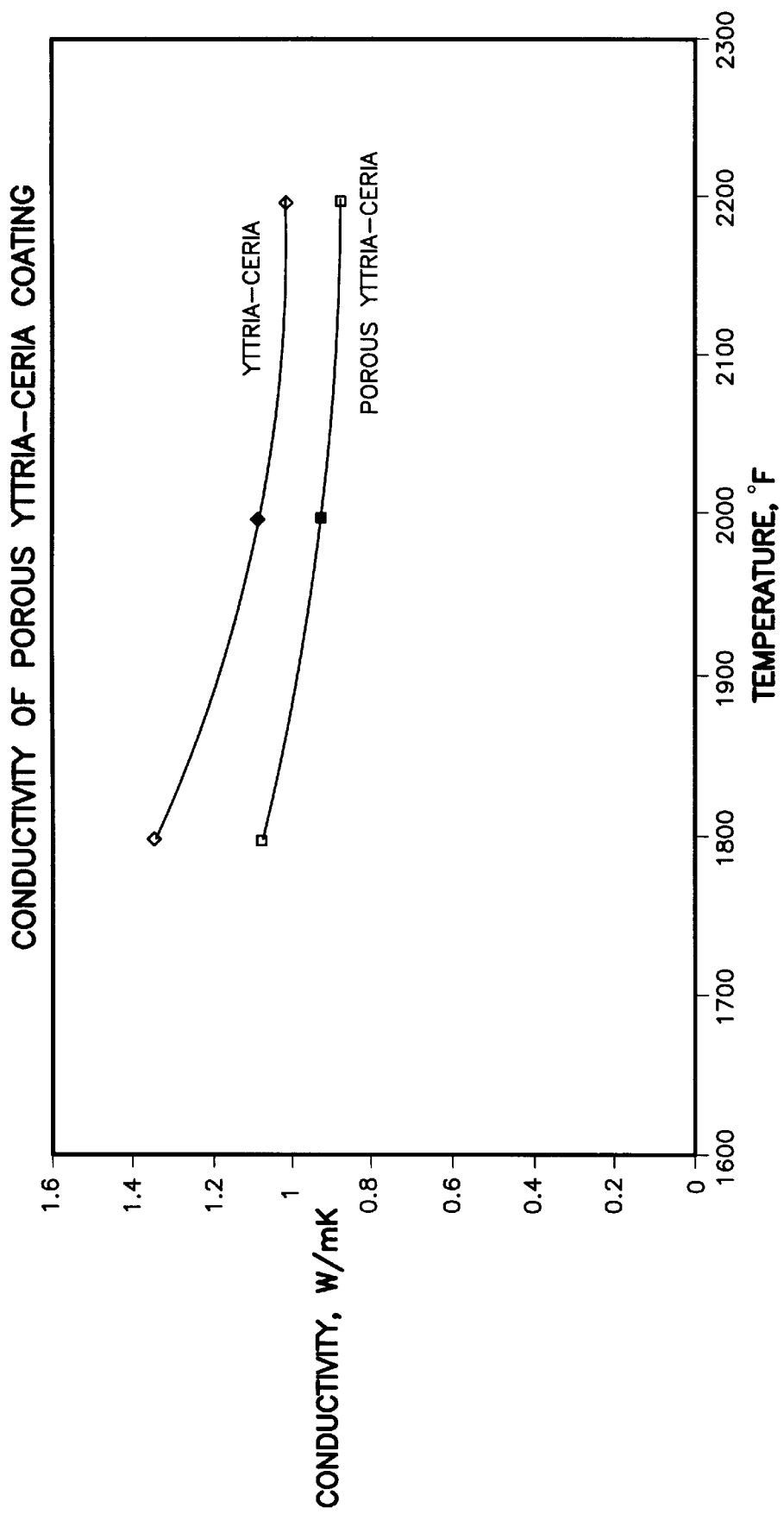
FIG. 4 shows the thermal conductivity of an exemplary coating of the invention and a corresponding coating which lacks the layered porosity provided by the present invention.

FIG. 4 is a plot of the thermal conductivity of the invention coating as described with respect to FIG. 2 and a corresponding non-layered-porosity coating. It can be seen that over a wide range of temperatures the thermal conductivity of the invention coating is substantially less than that of the prior art coating. Over the temperature range evaluated, the coating of the present invention displays a thermal conductivity which is significantly less than that of the prior art coating. This represents a significant enhancement in insulation capability.

The previous examples illustrate the invention using one composition of ceramic material. There are of course many compositions and combinations of ceramic materials which can be deposited. Some variations and alternate details are described below.

Substrate

Most broadly the substrate may comprise any high temperature material such as, for example, ceramics, carbon, carbon composites and the like as well as superalloys. For present gas turbine engine purposes, superalloys are most useful. Superalloys are metallic materials, based on iron, nickel or cobalt having yield strengths in excess of 50 ksi and more typically in excess of 100 ksi at 1,000° F.

As discussed below, bond coats are often desired to ensure coating adherence to the substrate, however, under some conditions, for some superalloys there may not be a need for a bond coat. Superalloys which can be coated without use of a bond can inherently develop a layer of high purity aluminum on their outer surfaces upon exposure to oxidizing conditions at elevated temperatures. An exemplary superalloy which does not require a bond coat is described in U.S. Pat. No. 5,262,245.

If the invention coating were to be applied to a ceramic material, for example alumina, there would generally not be a need for a bond coat.

Bond Coat

Most commonly a bond coat will be a part of the invention coating system. The requirement for a bond coat will depend on the substrate and on the requirements for thermal barrier coating performance, operating temperature, desired life and other environmental factors including thermal cycling and the environmental gas composition. The essential common features required of a useful bond coat are that it be adherent to the substrate, thermally and diffusionally stable, and form a stable, alumina layer which is adherent to the ceramic layer to be deposited in the operating environment.

There are a variety of bond coats which can be used with the present invention. These include overlay coating and aluminide coatings. Typical overlay coatings are described in U.S. Pat. Nos. 3,928,026 and 4,419,416 and are variations on nickel and cobalt base superalloys that have been optimized to develop adherent durable high purity alumina layers upon exposure to oxidizing conditions at elevated temperatures. Overlay coatings are applied to the surface of the substrate and are typified by the MCrAlY type coatings which have the following general, non-limiting composition (in weight percent): Cr 10–30, Al 5–15, Y(Y+Hf+La+Ce+Sc) 0.01–2, Si+Ta+Pt+Pd+Re+Rh+Os Os 0–5%, balance M (Fe, Ni, Co and combinations). Overlay coatings can be applied for example by plasma spraying, by EB-PVD and by electroplating.

Aluminide coatings are produced by diff-using aluminum into the substrate and are described, for example, in U.S. Pat. No. 5,514,482, which is expressly incorporated herein by reference. As used herein the term aluminide coating includes aluminide coatings modified by additions of Pt, Rh, Os, Pd, Ta, Re, Hf. Si, Cr and mixtures thereof.

It is also known to apply combinations of overlay and aluminide coatings, for example an aluminide coating can have an overlay coating applied over the aluminide, and vice versa.

Alumina Layer

An alumina layer, whether formed directly on the substrate or on a bond coat is an important invention feature. Most commonly the alumina layer will be thermally grown, but it is known to use sputtering to develop this layer. The broad thickness of the alumina layer is about 0.01–2 microns, preferably about 0.1–0.7 microns.

Ceramic Compositions

While yttria-ceria and gadolinia-zirconia are described in the above examples, virtually any ceramic composition that can be applied by physical vapor deposition can be used in the present invention. Other suitable ceramics, including gadolinia-zirconia are disclosed in commonly-owned U.S. patent application Ser. Nos. 09/164,700, filed on Oct. 1, 1998, and continuing prosecution application Ser. No. 08/764,419, filed on May 22, 1998, both entitled "Thermal Barrier Coating Systems and Materials" and expressly incorporated by reference herein.

The ceramic should be compatible with the bond coat and/or the substrate, the other ceramic compositions present in the coating, and the operating environment. The ceramic coating may comprise a single ceramic composition (as above) or different ceramic compositions applied as alternating layers. The critical feature is that the coating be processed to produce alternating Zone I/Zone II (or Zone III) layer structures. Preferably, the ceramics utilized are those which exhibit intrinsically low bulk thermal conductivity. These include stabilized zirconia, ceria with rare earth additions, and oxide pyrochlore compounds.

The arrangement of the ceramic coating can be quite varied. The broadest description is that the coating consists of multiple layers, at least one of which is deposited to have a Zone I type structure. Preferably the Zone I structure is subsequently heat treated to form or enhance porosity. Also, the Zone I structure layer preferably has Zone II (and/or Zone III) structure layers immediately adjoining it to provide mechanical support and constraint. Preferably there are a plurality of Zone I type layers deposited separated by layers having Zone II/Zone III type structures.

We believe that fine porosity will be most effective in reducing heat flow. This must be balanced against the idea that small pores are less stable since they tend to shrink and close up or heal at high temperatures. Pore closure will not be a significant problem if the use temperature is less than the pore shrinkage temperature.

In some circumstances other layers may be incorporated without detracting from the thermal insulating benefits of the invention. For example an outer layer may be selected to provide particular properties desired for particular applications, such as thermal emissivity, hardness, abrasion resistance, resistance to environmental attack (oxidation, sulfidation, nitridation etc.) and/or resistance to diffusion of adverse environmental species such as oxygen which would adversely affect the underlying coating layer and/or the bond coat and/or the substrate. For example alumina might be desired as an outer layer because it is relatively hard and is resistant to the diffusion of oxygen.

For seal applications many of the same considerations apply. Total coating thickness will generally be greater, up to about 100 mils, preferably 50 mils. Individual layer thickness and pore volume and pore size will be optimized to provide the mechanical properties required for abradability.

What is claimed is:

1. A method of applying a layered ceramic coating on a substrate including the steps of:

electron beam physical vapor depositing a plurality of ceramic layers from at least one evaporant source and onto the substrate; and alternating the temperature during vapor depositing by periodically positioning a heat blocking screen between the evaporant source and the substrate to reduce heat flow to form alternating layers of ceramic material with at least one layer being deposited at a first temperature and at least another layer being deposited at a second temperature different than the first temperature, wherein at least one of said layers has a Zone I microstructure and at least one of said layers has a Zone II microstructure.

2. A method as in claim 1, further comprising the step of:

heat treating the layer to produce porosity in one or more of the layers having a Zone I microstructure.

3. A method as in claim 1, wherein the layer deposited at the lower temperature is the layer having the Zone I type microstructure.

4. A method as in claim 1, wherein a single evaporant source is used.

5. A method as in claim 1, wherein the single evaporant source is composed of a stabilized ceria.

6. A method as in claim 1, wherein the single evaporant source is composed of a stabilized zirconia.

7. A method as in claim 1, wherein said substrate has a surface layer comprised primarily of alumina.

8. A method as in claim 7, wherein said alumina layer has a thickness of 0.1–2.0 microns.

9. A method as in claim 1, wherein said substrate has a bond coat selected from the group consisting of MCrAlY and aluminide layers and combinations thereof and said alumina layer is located on the surface of the bond coat.

10. A method as in claim 1, wherein the total thickness of the layers is from about 0.05 to about 5000 microns.

11. A method as in claim 1, wherein the substrate is composed of a material capable of forming an adherent alumina layer, and further comprising the step of forming an alumina layer on the substrate.

12. A method as in claim 1, wherein the step of vapor depositing includes vaporizing at lease two sources of ceramic material.

13. A method as in claim 12, wherein the sources of ceramic material have different compositions.

14. A method as in claim 1, wherein the substrate defines a gas turbine engine component.

15. A method as in claim 1, wherein the substrate is composed of a superalloy material capable of forming an adherent alumina layer, and further comprising the step of forming an alumina layer on the substrate.

* * * * *